(12) United States Patent
Kouno et al.

(10) Patent No.: US 11,527,966 B2
(45) Date of Patent: Dec. 13, 2022

(54) POWER CONVERSION APPARATUS THAT JUDGES SYSTEM POWER FAILURE BASED ON SYSTEM FREQUENCY AND VOLTAGE

(71) Applicants: KABUSHIKI KAISHA TOSHIBA, Tokyo (JP); Toshiba Infrastructure Systems & Solutions Corporation, Kawasaki (JP)

(72) Inventors: Yuusuke Kouno, Tachikawa (JP); Yoichi Morishima, Tokyo (JP)

(73) Assignees: KABUSHIKI KAISHA TOSHIBA, Tokyo (JP); Toshiba Infrastructure Systems & Solutions Corporal, Kawasaki (JP)

( * ) Notice: Subject to any disclaimer, the term of this patent is extended or adjusted under 35 U.S.C. 154(b) by 158 days.

(21) Appl. No.: 17/073,605

(22) Filed: Oct. 19, 2020

(65) Prior Publication Data
US 2021/0288592 A1    Sep. 16, 2021

(30) Foreign Application Priority Data
Mar. 11, 2020    (JP) .............................. JP2020-041699

(51) Int. Cl.
| | | |
|---|---|---|
| H02J 3/42 | (2006.01) | |
| H02M 7/537 | (2006.01) | |
| H02H 7/122 | (2006.01) | |
| H02H 3/353 | (2006.01) | |
| G01R 23/15 | (2006.01) | |
| G01R 19/25 | (2006.01) | |
| G01R 19/165 | (2006.01) | |
| H02M 1/00 | (2006.01) | |

(52) U.S. Cl.
CPC ...... *H02M 7/537* (2013.01); *G01R 19/16538* (2013.01); *G01R 19/2513* (2013.01); *G01R 23/15* (2013.01); *H02H 3/353* (2013.01); *H02H 7/1225* (2013.01); *H02J 3/42* (2013.01); *H02M 1/0003* (2021.05)

(58) Field of Classification Search
CPC ........ H02J 3/42; H02M 7/537; H02M 1/0003; G01R 19/16538; G01R 23/15; G01R 19/2513; H02H 7/1225; H02H 3/353
See application file for complete search history.

(56) References Cited

U.S. PATENT DOCUMENTS

2014/0300187 A1* 10/2014 Kojima .................. H02J 3/381
307/24

FOREIGN PATENT DOCUMENTS

| JP | 2006-101634 A | 4/2006 |
|---|---|---|
| JP | 2017153252 A * | 8/2017 |
| JP | 2018-152933 A | 9/2018 |

* cited by examiner

*Primary Examiner* — Harry R Behm
(74) *Attorney, Agent, or Firm* — Maier & Maier, PLLC

(57) ABSTRACT

An apparatus according to an embodiment includes a control circuit to control operations of an inverter and a switch. The control circuit judges whether or not a power system has a power failure, based on values of the system voltage and a frequency of the power system; and calculates a phase difference between a phase of the output voltage of the inverter and a phase of the system voltage and generate, by means of the phase difference, an output frequency pattern for changing a frequency of the output voltage of the inverter. The control circuit, when it is judged that the power system has recovered from the power failure, controls the inverter to change the frequency of the output voltage of the inverter in line with the output frequency pattern, and closes the switch after the phase difference becomes smaller than or equal to a threshold.

6 Claims, 8 Drawing Sheets

POWER CONVERSION APPARATUS THAT JUDGES SYSTEM POWER FAILURE BASED ON SYSTEM FREQUENCY AND VOLTAGE

CROSS-REFERENCE TO RELATED APPLICATIONS

This application is based upon and claims the benefit of priority from Japanese Patent Application No. 2020-041699, filed Mar. 11, 2020; the entire contents of which are incorporated herein by reference.

FIELD

Embodiments relate generally to a power conversion apparatus.

BACKGROUND

A power conditioning system (PCS) that converts DC power, which can be output from a power supply, such as a solar battery or a secondary battery, into AC power to supply power output from the power supply to an electric load or to sell the power to a power system is in widespread use.

When power fails in a power system, a PCS for distributed power supplies can supply power to an electric load by performing standalone operation. When power is restored in the power system, the PCS under standalone operation is switched from standalone operation to interconnected operation; the however, when there is a phase difference between the output voltage of the inverter and the system voltage, the PCS may be stopped by overvoltage or overcurrent. Therefore, a PCS that halts its standalone operation when power is restored in the power system and then switches to an interconnected operation with the power system is in use.

However, when the PCS is halted, power supply to the electric load is halted, and an instantaneous power failure state may be caused; therefore, it is desired that, upon power restoration of the power system, the PCS is switched from standalone operation to interconnected operation with no interruption so that power is continuously supplied to the electric load.

Upon switching of a PCS from an standalone operation to an interconnected operation, if the phase of the output voltage of the inverter is rapidly synchronized with the phase of the system voltage, there may be an adverse effect on an electric load, whereas, if the synchronization is achieved gently, energy stored in a power storage device in the power supply is wasted. Therefore, it has been required to change the frequency of the inverter within a capacity range of the electric load and rapidly synchronize the phase of the output voltage of the inverter with the phase of the system voltage.

DETAILED DESCRIPTION

A power conversion apparatus according to an embodiment includes a power supply; an inverter configured to convert DC power supplied from the power supply into AC power and AC power supplied from a power system into DC power; a switch configured to switch an electrical connection state of an AC line extending between an AC terminal of the inverter and an input terminal from the power system; a first voltage detector configured to detect an output voltage of the inverter; a second voltage detector configured to detect a system voltage of the power system; and a control circuit configured to control operations of the inverter and the switch. The control circuit judges whether or not the power system has a power failure, based on values of the system voltage and a frequency of the power system, calculates, when the power system has recovered from the power failure, a phase difference between a phase of the output voltage of the inverter and a phase of the system voltage and generate, by means of the phase difference, an output frequency pattern for changing a frequency of the output voltage of the inverter, and when it is judged that the power system has recovered from the power failure, controls the inverter to change the frequency of the output voltage of the inverter in line with the output frequency pattern and closes the switch after the phase difference becomes smaller than or equal to a threshold.

Hereinafter, power conversion apparatuses of embodiments will be described with reference to the accompanying drawings.

Figure 1:
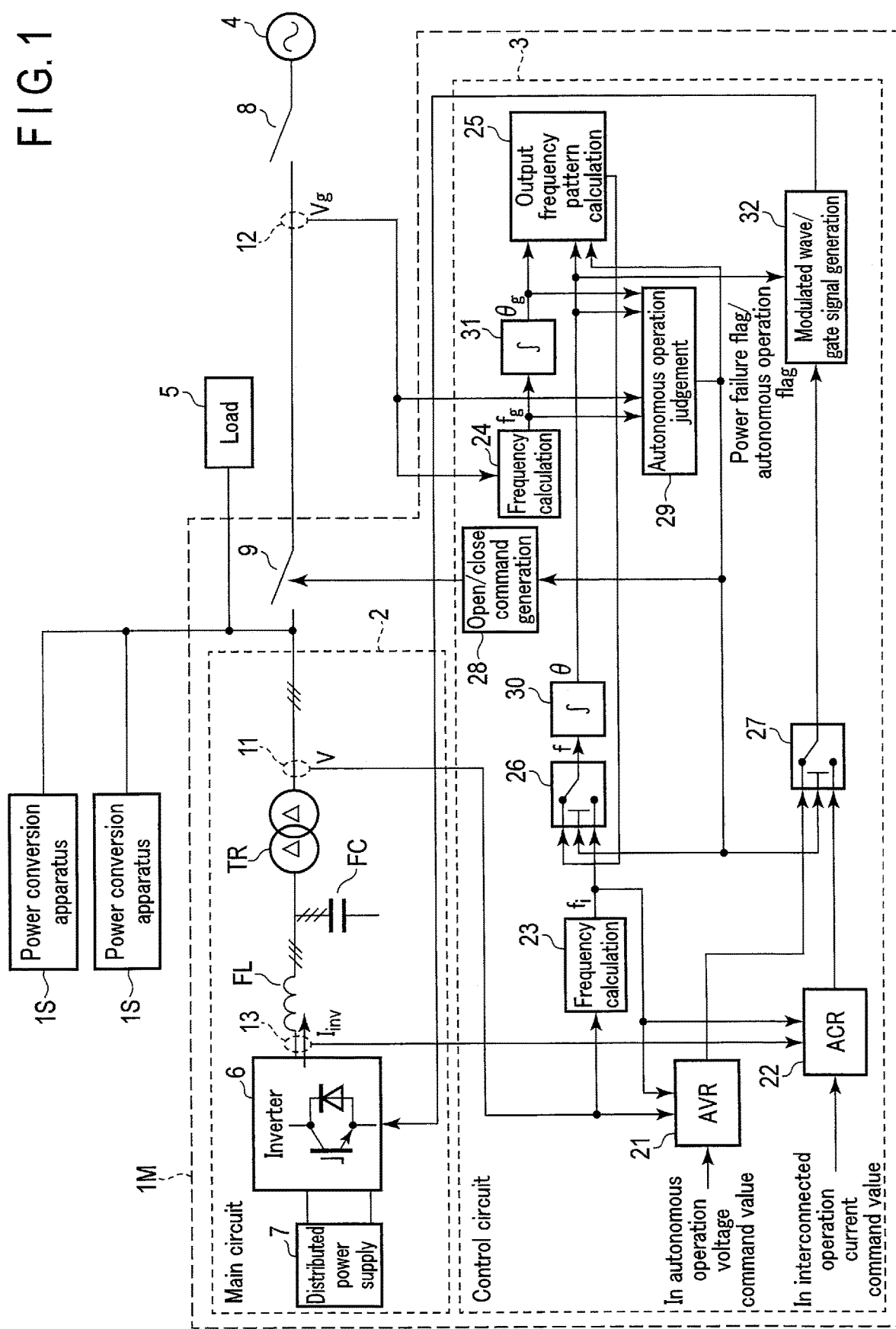
FIG. 1 is a schematic diagram showing a configuration example of a power conversion apparatus of a first embodiment.

FIG. 1 is a schematic diagram showing a configuration example of a power conversion apparatus of a first embodiment.

FIG. 1 shows an example in which a plurality of power conversion apparatuses 1 are connected to a power system 4 and an electric load 5. As the electric load 5, electric loads used by various consumers are applicable, examples of which include various devices that operate with power, such as various electronic devices to which power is supplied through a plug in ordinary households, commercial facilities, industrial facilities, medical facilities, and the like, and a lighting device, an elevator, an air conditioning equipment, and the like installed in facilities.

The power conversion apparatuses 1 may include at least one master apparatus 1M and a plurality of slave apparatuses 1S. Each slave apparatus 1S operates based on a command from the master apparatus 1M. The master apparatus 1M provides a command to each slave apparatus 1S so that the power conversion apparatuses 1 cooperate with one another.

Hereinafter, a configuration of the power conversion apparatus 1 will be described with the master apparatus 1M taken as an example of the power conversion apparatus 1. The slave apparatuses 1S usually have the same configuration as the master apparatus 1M. Alternatively, the slave apparatuses 1S may be omitted.

The power conversion apparatus of the present embodiment includes a main circuit 2, a control circuit 3, and a switch 9.

The main circuit 2 includes a distributed power supply 7, an inverter 6, a reactor FL, a transformer TR, and a capacitor FC.

The distributed power supply 7 may include at least one DC power supply, such as a solar battery, a fuel battery, or a secondary battery. The distributed power supply 7 may be configured by combining DC power supplies of the aforementioned types. The distributed power supply 7 may, for example, output DC power to the inverter 6, and be charged with DC power supplied from the inverter 6.

The inverter 6 is a three-phase AC inverter capable of mutual conversion between DC power and three-phase AC power. The inverter 6 includes U-phase, V-phase, and W-phase arms electrically connected between a positive DC terminal and a negative DC terminal. Each phase arm includes an upper switching element and a lower switching element, and is electrically connected to a corresponding AC terminal between the upper switching element and the lower switching element.

The reactor FL and capacitor FC constitute a filter circuit which eliminates noise from AC power output from the inverter 6, and is interposed between the transformer TR and each phase AC terminal of the inverter 6. The reactor FL is connected in series to an AC line connected between the transformer TR and each AC terminal of the inverter 6.

The transformer TR includes a first coil and a second coil. The first coil is insulated from the second coil. The first coil is electrically connected to each AC terminal of the inverter 6 via the filter circuit. The second coil is electrically connected to the power system 4 via switches 9 and 8, and is electrically connected to the electric load 5. The transformer TR is an insulating transformer capable of changing the voltage of AC power transferred between the inverter 6 and the power system 4.

The control circuit 3 may be constituted by hardware, software, or a combination thereof. The control circuit 3 includes, for example, at least one processor and a memory storing therein a program to be executed by the processor, and is configured to implement various functions to be described below.

The control circuit 3 generates and outputs a gate signal for controlling the operations of the switching elements of the inverter 6 on the basis of the current value and voltage value of AC power output from the inverter 6, the voltage value (system voltage value) of AC power output from the power system 4, and a command value externally supplied.

The control circuit 3 includes a voltage controller (AVR) 21, a current controller (ACR) 22, a first frequency calculator 23, an inverter frequency selection unit 26, an inverter voltage command value selection unit 27, a first phase calculator 30, a second frequency calculator 24, an standalone operation judgment unit 29, a second phase calculator 31, a modulated wave/gate signal generator 32, an output frequency pattern calculator 25, an open/close command generator 28, a first voltage detector 11, a second voltage detector 12, and a current detector 13.

The first voltage detector 11 detects a value of the voltage V of AC power output from the inverter 6. The value of the voltage (inverter output voltage) V detected at the first voltage detector 11 is supplied to the voltage controller 21 and the first frequency calculator 23.

The second voltage detector 12 detects a value of the voltage Vg of AC power output from the power system 4. The value of the voltage (system voltage) Vg detected at the second voltage detector 12 is supplied to the second frequency calculator 24 and the standalone operation judgment unit 29.

The current detector 13 detects a value of the current Iinv of the AC power output from the inverter 6. The current detector 13, for example, detects a value of the current Iinv for at least two phases of the three-phase AC power output from the inverter 6. The value of the current (inverter current) Iinv detected at the current detector 13 is supplied to the current controller 22.

The first frequency calculator 23 acquires the value of the output voltage V of the inverter from the first voltage detector 11, and calculates and outputs a frequency fi of the output voltage of the inverter 6. The value of the frequency output from the first frequency calculator 23 is supplied to the voltage controller 21, the current controller 22, and the inverter frequency selection unit 26.

The second frequency calculator 24 acquires the value of the system voltage Vg from the second voltage detector 12, and calculates and outputs a value of a frequency fg of the output voltage of the power system 4. The value of the frequency fg output from the second frequency calculator 24 is supplied to the standalone operation judgment unit 29 and the second phase calculator 31.

The second phase calculator 31 acquires the value of the frequency fg of the output voltage of the power system from the second frequency calculator 24, and calculates a value of a phase θg by integrating the value of the frequency fg. The value of the phase θg output from the second phase calculator 31 is supplied to the output frequency pattern calculator 25 and the standalone operation judgment unit 29.

The standalone operation judgment unit 29 acquires the value of the system voltage Vg from the second voltage detector 12, acquires the value of the frequency fg of the system voltage from the second frequency calculator 24, and judges whether or not the power system 4 has a power failure. The standalone operation judgment unit 29 can judge whether or not the power system 4 has a power failure based on whether or not each of the value of the system voltage Vg and the value of the system frequency fg is within a predetermined range. When judging that the power system 4 has a power failure, the standalone operation judgment unit 29 sets "1" as a power failure flag, whereas, when judging that the power system 4 is normal, the standalone operation judgment unit 29 sets "0" as a power failure flag.

The standalone operation judgment unit 29 also acquires the phase value θg of the system voltage Vg from the second phase calculator 31, acquires the phase value θ of the output voltage V of the inverter 6 from the first phase calculator 30 to be described later, and performs control to switch the operation mode of the power conversion apparatus 1 between standalone operation and interconnected operation on the basis of the phase value θg and the phase value θ. For example, when the difference between the phase value θg of the system voltage Vg and the phase value θ of the output voltage V of the inverter 6 is smaller than a predetermined threshold, the standalone operation judgment unit 29 judges that the power conversion apparatus 1 under standalone operation can be switched to interconnected operation with the power system 4 and changes the standalone operation flag from "1" to "0" For example, when judging that the power system 4 has a power failure, the standalone operation judgment unit 29 judges that the power conversion apparatus 1 under interconnected operation with the power system 4 should be switched to standalone operation, and changes the standalone operation flag from "0" to "1".

The standalone operation judgment unit 29 supplies the power failure flag and the standalone operation flag to the inverter frequency selection unit 26, the inverter voltage command value selection unit 27, the open/close command generator 28, and the output frequency pattern calculator 25.

The open/close command generator 28 generates and outputs an open/close command for the switch 9 in accordance with the values of the power failure flag and standalone flag supplied from the standalone operation judgment unit 29. The open/close command generator 28 generates an open/close command to open the switch 9 when the power failure flag is "1", and generates an open/close command to close the switch 9 when the power failure flag is "0" and the standalone operation flag is "0".

The voltage controller 21 receives a voltage command value externally input, the value of the output voltage V of the inverter 6, and the output value of the first frequency calculator 23. The voltage controller 21 can externally receive a voltage command value when the power conversion apparatus 1 is in standalone operation and calculate a voltage command value of the inverter 6.

The voltage controller 21 uses the received values to calculate the voltage command value of the inverter 6 so that the value of the output voltage V follows the externally received voltage command value, and outputs the calculated voltage command value of the inverter 6. The voltage controller 21 is, for example, a proportional-plus-integral (PI) controller which calculates a voltage command value so that the difference between the value of the output voltage V and the externally received voltage command value becomes zero. The voltage command value output from the voltage controller 21 is supplied to the inverter voltage command value selection unit 27.

The current controller 22 receives a current command value externally input, the value of the output current Iinv of the inverter 6, and the output value of the first frequency calculator 23. The current controller 22 can externally receive a current command value when the power conversion apparatus 1 is in interconnected operation and calculate a voltage command value of the inverter 6.

The current controller 22 uses the received values to calculate the voltage command value of the inverter 6 so that the value of the output current Iinv follows the current command value, and outputs the calculated voltage command value of the inverter 6. The current controller 22 is, for example, a proportional-plus-integral (PI) controller which calculates a voltage command value so that the difference between the value of the output current Iinv and the current command value becomes zero. The voltage command value output from the current controller 22 is supplied to the inverter voltage command value selection unit 27.

The inverter frequency selection unit 26 selects one of the output value of the first frequency calculator 23 and that of the output frequency pattern calculator 25 on the basis of the value of the power failure flag and standalone operation flag supplied from the standalone operation judgment unit 29, and outputs the selected output value as the value of the frequency f of the output voltage of the inverter 6. The value of the frequency f output from the inverter frequency selection unit 26 is supplied to the first phase calculator 30.

When the power conversion apparatus 1 is in interconnected operation with the power system 4, the inverter frequency selection unit 26 selects the output value of the first frequency calculator 23 as the value of the frequency f of the output voltage of the inverter 6. Namely, when the power failure flag is "0" and the standalone operation flag is "0", the inverter frequency selection unit 26 selects the output value of the first frequency calculator 23 as the value of the frequency f of the output voltage of the inverter 6.

When the power conversion apparatus 1 is in standalone operation, the inverter frequency selection unit 26 selects the output value of the output frequency pattern calculator 25 as the value of the frequency f of the output voltage of the inverter 6. Namely, when the power failure flag is "1" and the standalone operation flag is "1", the inverter frequency selection unit 26 selects a preset value of a rated frequency, which is an output value of the output frequency pattern calculator 25, as the value of the frequency f of the output voltage of the inverter 6.

When the power system 4 recovers from a power failure while the power conversion apparatus 1 is in standalone operation, i.e., when the standalone flag is "1" and the power failure flag changes from "1" to "0", the output value of the output frequency pattern calculator 25 becomes a value that changes based on an output frequency pattern, as will be described later, and is output from the inverter frequency selection unit 26 as the value of the frequency f of the output voltage of the inverter 6.

The first phase calculator 30 integrates the value of the frequency f supplied from the inverter frequency selection unit 26 to calculate the value of the phase $\theta$ of the output voltage of the inverter 6. The first phase calculator 30 supplies the calculated value of the phase $\theta$ to the standalone operation judgment unit 29, the output frequency pattern calculator 25, and the modulated wave/gate signal generator 32.

The inverter voltage command value selection unit 27 selects one of the output value of the voltage controller 21 and that of the current controller 22 on the basis of the values of the power failure flag and standalone operation flag supplied from the standalone operation judgment unit 29, and outputs the selected output value as the voltage command value of the inverter 6. The voltage command value output from the inverter voltage command value selection unit 27 is supplied to the modulated wave/gate signal generator 32.

When the power conversion apparatus 1 is in interconnected operation with the power system 4, the inverter voltage command value selection unit 27 outputs the output value of the current controller 22 as the voltage command value of the inverter 6. Namely, when the power failure flag is "0" and the standalone operation flag is "0", the inverter voltage command value selection unit 27 outputs the output value of the current controller 22 as the voltage command value of the inverter 6.

When the power conversion apparatus 1 is in standalone operation, the inverter voltage command value selection unit 27 outputs the output value of the voltage controller 21 as the voltage command value of the inverter 6. Namely, when the standalone failure flag is "1", the inverter voltage command value selection unit 27 outputs the output value of the voltage controller 21 as the voltage command value of the inverter 6.

The modulated wave/gate signal generator 32 generates modulated waves on the basis of the value of the phase $\theta$ of the output voltage of the inverter 6 received from the first phase calculator 30 and the voltage command value received from the inverter voltage command value selection unit 27. The modulated wave/gate signal generator 32 compares the generated modulated waves with carrier waves to generate a gate signal of each switching element of the inverter 6, and outputs the gate signal to the inverter 6.

When the power conversion apparatus 1 is switched from standalone operation to interconnected operation with the power system 4 (when the power failure flag changes from "1" to "0"), the output frequency pattern calculator 25 calculates the pattern of the frequency f of the output voltage V of the inverter 6 so that the frequency f is synchronized with the frequency of the system voltage Vg.

Figure 2:
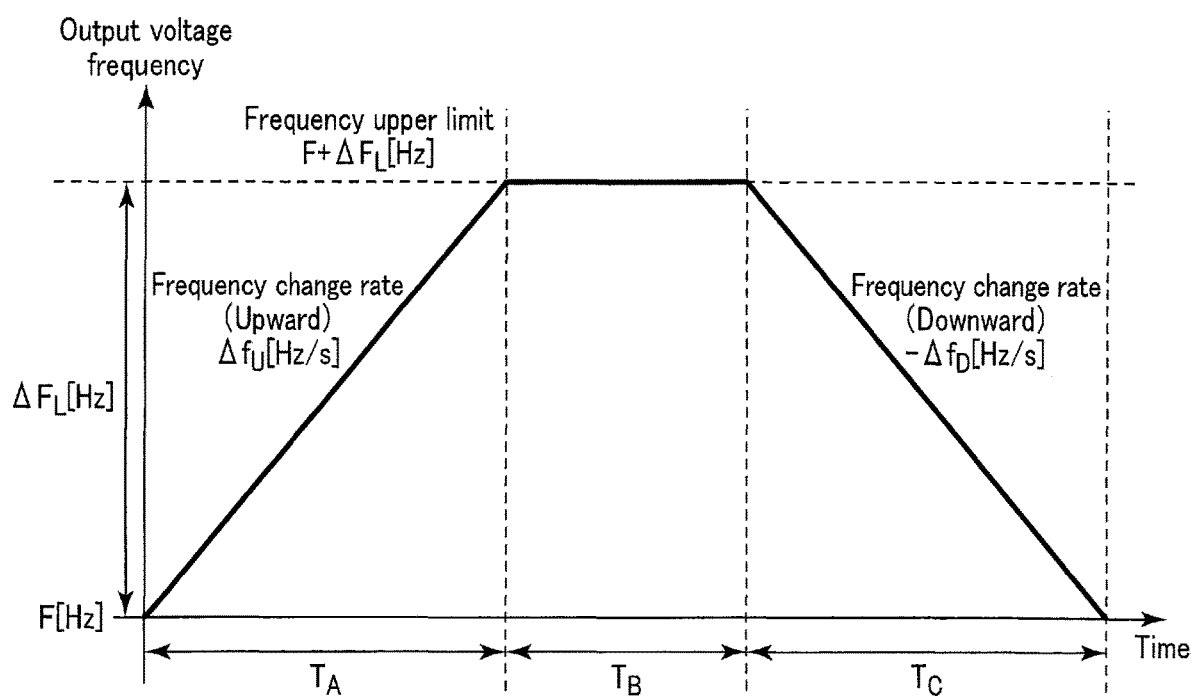
FIG. 2 is a schematic diagram showing an example of an output frequency pattern calculated in an output frequency pattern calculator in the power conversion apparatus of the first embodiment.

FIG. 2 is a schematic diagram showing an example of the frequency pattern calculated in the output frequency pattern calculator in the power conversion apparatus of the first embodiment.

The output frequency pattern includes at least periods $T_A$ and $T_C$ in which the frequency is changed at a preset frequency change rate. In the example shown in FIG. 2, the output frequency pattern further includes a period $T_B$ in which the frequency takes a constant value at the frequency upper limit or frequency lower limit. Shown herein is an example of the output frequency pattern for synchronizing the phase θ of the output voltage V of the inverter 6 with the phase θg of the system voltage Vg when the phase θg is advanced with respect to the phase θ.

When the phase θg of the system voltage Vg is delayed with respect to the phase θ of the output voltage V of the inverter 6, an output frequency pattern is generated in which the frequency f of the output voltage V of the inverter 6 is lowered at a preset frequency change rate for the predetermined period $T_A$ and, after passing through the period $T_B$, in which the frequency f takes a constant value at the frequency lower limit where necessary, raised at a predetermined frequency change rate for the predetermined period $T_C$ back to the rated frequency.

In the following description, the phase difference between the phase θg of the system voltage Vg and the phase θ of the output voltage V of the inverter 6 is denoted as Δθ. In addition, the rated frequency is denoted as F[Hz], the frequency change upper limit is denoted as $\Delta F_L$ [Hz], the frequency change rate (upward) is denoted as $f_U$[Hz/s], and the frequency change rate (downward) is denoted as $-\Delta f_D$ [Hz/s]. Furthermore, the period of an operation at the upward frequency change rate is denoted as $T_A$[s], the period of an operation at a constant value at the frequency upper limit (or frequency lower limit) is denoted as $T_B$ [s], and the period of an operation at the downward frequency change rate is denoted as $T_C$[s].

First, in the period $T_A$, the frequency f is changed from the rated frequency F to the frequency upper limit $F+\Delta F_L$; accordingly, the period $T_A$[s] can be expressed by the following expression (1):

[Expression 1]

$$T_A = \frac{\Delta F_L}{\Delta f_U} \quad (1)$$

The phase change amount $\Delta\theta_G$ in the period $T_A$ can be expressed by the following expression (2):

[Expression 2]

$$\Delta\theta_A = \int_0^{T_A} 2\pi \Delta f_U t \, dt = \pi \Delta f_U (T_A)^2 = \pi \frac{\Delta F_L^2}{\Delta f_U} \quad (2)$$

Similarly, since the frequency f changes from the frequency upper limit $F+\Delta F_L$ back to the rated frequency F in the period $T_C$, the period $T_C$ and the phase change amount $\Delta\theta_C$ can be expressed by the following expressions (3) and (4):

[Expression 3]

$$T_C = \frac{\Delta F_L}{\Delta f_D} \quad (3)$$

$$\Delta\theta_C = \pi \frac{\Delta F_L^2}{\Delta f_D} \quad (4)$$

The phase change amount $\Delta\theta_B$ in the period $T_B$ and the period $T_B$ can be expressed by the following expressions (5) and (6):

[Expression 4]

$$\Delta\theta_B = \Delta\theta - \Delta\theta_A - \Delta\theta_C \quad (5)$$

$$T_B = \frac{\Delta\theta_B}{2\pi\Delta F_L} = \frac{\Delta\theta - \Delta\theta_A - \Delta\theta_C}{2\pi\Delta F_L} = \frac{\Delta\theta}{2\pi\Delta F_L} - \frac{1}{2}\left(\frac{\Delta F_L}{\Delta f_U} + \frac{\Delta F_L}{\Delta f_D}\right) \quad (6)$$

Based on the above expressions (1), (3) and (6), the periods $T_A$, $T_B$, and $T_C$ are uniquely determined. Therefore, the output frequency pattern calculator 25 can determine the output frequency pattern of the output voltage V of the inverter 6 by calculating the phase difference Δθ between the phase θg of the system voltage Vg and the phase θ of the output voltage V of the inverter 6 and substituting preset values and ΔG into the above expressions (1), (3), and (6).

Depending on the value of Δθ, the phase G and the phase θg may be synchronized with each other without raising the frequency of the output voltage of the inverter 6 up to the frequency upper limit. The condition therefor is the case of $T_B \leq 0$ in the expression (6), and is expressed by the following expression (7):

[Expression 5]

$$\Delta\theta \leq \pi \Delta F_L^2 \left(\frac{1}{\Delta f_U} + \frac{1}{\Delta f_D}\right) \quad (7)$$

In this case, Δθ is a sum of $\Delta\theta_A$ and $\Delta\theta_C$, and the frequency change amount in the period $T_A$ is equal to that in the period $T_C$; therefore, the following expressions (8) and (9) are satisfied:

[Expression 6]

$$\Delta\theta = \pi \Delta f_U (T_A)^2 + \pi \Delta f_D (T_C)^2 \quad (8)$$

$$\Delta f_U T_A = \Delta f_D T_C \quad (9)$$

Based on the above expressions (8) and (9), the period $T_A$ and period $T_C$ can be expressed by the following expressions (10) and (11):

[Expression 7]

$$T_A = \sqrt{\frac{\Delta f_D}{\Delta f_U (\Delta f_U + \Delta f_D)\pi} \Delta\theta} \quad (10)$$

$$T_C = \sqrt{\frac{\Delta f_U}{\Delta f_D(\Delta f_U + \Delta f_D)\pi}\Delta\theta} \qquad (11)$$

Based on the above expressions (10) and (11), the period $T_A$ and period $T_C$ of the case without the period $T_B$ are uniquely determined. Therefore, also in this case, the output frequency pattern calculator 25 can determine the output frequency pattern of the output voltage V of the inverter 6 by calculating the phase difference OB between the phase θg of the system voltage Vg and the phase θ of the output voltage V of the inverter 6 and substituting preset values and LG into the above expressions (10) and (11).

The output frequency pattern calculator 25 supplies the inverter frequency selection unit 26 with the value of the frequency that changes based on the calculated output frequency pattern.

In the power conversion apparatus 1, when the power system 4 is normal, the switches 8 and 9 are closed, and the main circuit 2 is interconnected with the power system 4. The control circuit 3 acquires the output current Iinv of the inverter 6 from the current detector 13, and calculates, at the current controller 22, a voltage command value to follow the current command value provided from outside (host controller). At this time, the power failure flag and standalone operation flag set at the standalone operation judgment unit 29 are both "0".

When an abnormality occurs in the power system 4, the downstream of the switch 8 falls into a power cut state through opening of the switch 8 provided in the power system, the control circuit 3 detects, at the standalone operation judgment unit 29, that the value of the frequency fg of the system voltage Vg detected at the second voltage detector 12 has deviated from a predetermined value (normal range), and sets "1" as the power failure flag and the standalone operation flag. In this case, the switch 9 is opened by an open/close command output from the open/close command generator 28.

When power fails in the power system 4, the voltage command value is calculated at the voltage controller 21 to follow the voltage command provided from outside (host controller), the input value of the inverter voltage command value selection unit 27 is switched, and the output value of the output frequency pattern calculator 25 (preset and fixed value of the rate frequency) is used as the frequency f of the output voltage of the inverter 6.

When the power system 4 recovers from a power failure, the value of the system voltage Vg detected at the second voltage detector 12 and the value of the frequency fg of the system voltage Vg respectively fall within predetermined values (normal ranges), which enables the standalone operation judgment unit 29 to judge that the power system 4 has recovered from a power failure. At this time, the standalone operation judgment unit 29 changes the power failure flag from "1" to "0". The output frequency pattern calculator 25 calculates the phase difference Δθ between the phase θ of the output voltage of the inverter 6 and the phase θg of the system voltage, and calculates the inverter output frequency pattern as described above.

The output frequency pattern calculator 25 changes the value of the frequency to be supplied to the inverter frequency selection unit 26 on the basis of the calculated output frequency pattern. The inverter frequency selection unit 26 outputs the output value of the output frequency pattern calculator 25 as the frequency f of the inverter 6. At this time, the effective value of the output voltage V of the inverter 6 is conformed to the effective value of the system voltage Vg with a predetermined change rate on the basis of a voltage command value externally supplied. Alternatively, control may be performed by correcting the voltage command value in the power conversion apparatus in accordance with the effective value of the system voltage Vg.

When the phase difference between the phase θ of the output voltage V of the inverter 6 and the phase θg of the system voltage Vg falls within a predetermined value, the standalone operation judgment unit 29 judges that interconnected operation should be performed (the standalone operation flag should be "0"). When "0" is set as the standalone operation flag, a command to close the switch 9 on the inverter 6 side is output from the open/close command generator 28.

When interconnected operation with the power system 4 starts, switching to control by the current controller 22 takes place, and the input value of the inverter voltage command value selection unit 27 is switched to the output value of the current controller 22. By setting the current command value at the time of starting interconnected operation to zero, overcurrent at the time of re-interconnection can be reduced.

Switching between control by the voltage controller 21 and control by the current controller 22 may be performed in accordance with the value of the standalone operation flag, or may be performed by switching of the command value input by the host controller. When switching between the voltage control and current control is performed in accordance with the value of the standalone operation flag, the value of the standalone operation flag may be supplied to the voltage controller 21 and the current controller 22.

Figure 3:
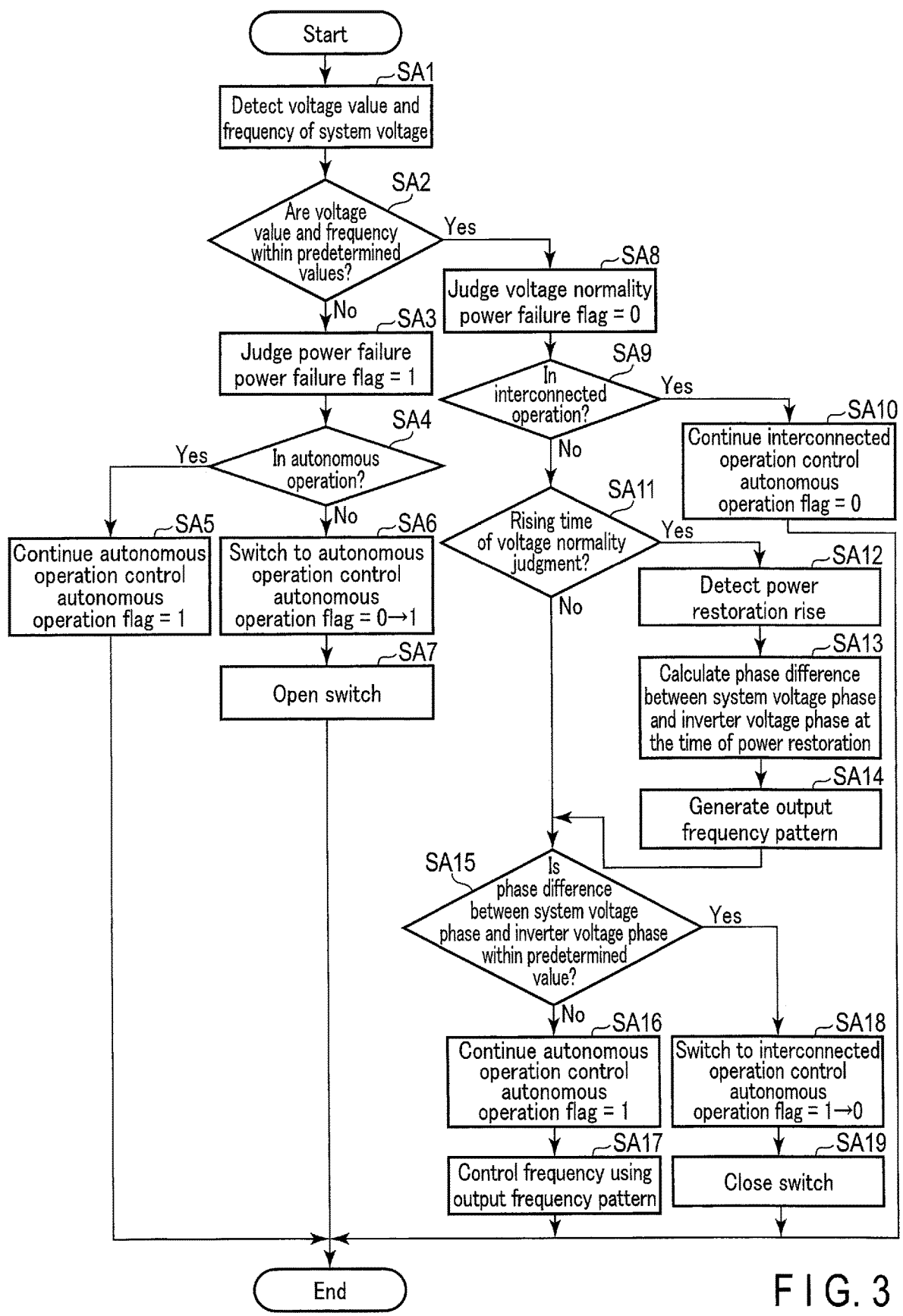
FIG. 3 is a flowchart illustrating an example of an operation of the power conversion apparatus of the first embodiment.

FIG. 3 is a flowchart illustrating an example of the operation of the power conversion apparatus of the first embodiment.

The standalone operation judgment unit 29 acquires the value of the system voltage Vg and the value of the frequency fg of the power system 4 (step SA1), judges whether or not each of the value of the system voltage Vg and the value of the frequency fg is within a normal range (smaller than or equal to a predetermined upper limit and larger than or equal to a predetermined lower limit) (step SA2), and monitors whether the power system 4 is normal or has a power failure.

When the value of the system voltage Vg and the value of the frequency fg are not within normal ranges, respectively, the standalone operation judgment unit 29 sets "1" as the power failure flag (step SA3).

Next, the standalone operation judgment unit 29 judges whether or not the power conversion apparatus 1 is in standalone operation (whether the standalone operation flag is "0" or "1") (step SA4), and maintains the state where the standalone operation flag is "1" when the power conversion apparatus 1 is in standalone operation, thereby causing the power conversion apparatus 1 to continue standalone operation (step SA5).

When the power conversion apparatus 1 is in interconnected operation, the standalone operation judgment unit 29 changes the standalone operation flag from "0" to "1" (step SA6). When "1" is set as the standalone operation flag, the open/close command generator 28 opens the switch 9 through a command to open the switch 9 (step SA7).

When the value of the system voltage Vg and the value of the frequency fg are respectively within normal ranges in step SA2, the standalone operation judgment unit 29 sets "0" as the power failure flag (step SA8).

Then, the standalone operation judgment unit 29 judges whether or not the power conversion apparatus 1 is in interconnected operation (whether the standalone operation flag is "0" or "1") (step SA9), and maintains the state where the standalone operation flag is "0" when the power conversion apparatus 1 is in interconnected operation, thereby causing the power conversion apparatus 1 to continue interconnected operation (step SA10).

When the power conversion apparatus 1 is not in interconnected operation, the standalone operation judgment unit 29 judges whether or not the time is a rising time of voltage normality judgment (step SA11). Whether or not the time is a rising time of voltage normality judgment can be judged based on whether or not the value of the system voltage Vg is within the normal range (whether or not the power failure flag is "0") in step SA2 of the previous judgment flow. The standalone operation judgment unit 29 judges that the time is a rising time of voltage normality judgment, for example when the value of the system voltage Vg is judged as not falling within the normal range (the power failure flag is "1") in step SA2 of the previous judgment flow and the power failure flag is changed from "1" to "0" by the judgment in step SA2 of the present judgment flow. The standalone operation judgment unit 29 judges that the time is not a rising time of voltage normality judgment, for example when the value of the system voltage Vg is judged as falling within the normal range (the power failure flag is "0") in step SA2 of the previous judgment flow and the value of the system voltage Vg is judged as falling within the normal range (the power failure flag remains "0") also in step SA2 of the present judgment flow.

When judging that the time is a rising time of voltage normality judgment, the standalone operation judgment unit 29 detects a rise of power restoration of the power system 4 (step SA12).

When the power failure flag changes from "1" to "0" and the standalone operation flag is "1", the output frequency pattern calculator 25 calculates the phase difference $\Delta G$ between the phase $\theta g$ of the system voltage Vg and the phase $\theta$ of the output voltage V of the inverter 6 at the present time (at the time of power restoration) (step SA13), and generates an output frequency pattern of the output voltage V of the inverter 6 using the above-mentioned expressions (1), (3), and (6) or expressions (10) and (11) (step SA14).

The output frequency pattern calculator 25 supplies the inverter frequency selection unit 26 with the value of the frequency that changes in line with the generated output frequency pattern, and outputs the value as the value of the frequency f of the output voltage of the inverter 6. Accordingly, the output voltage of the inverter 6 is controlled so that the frequency changes based on the output frequency pattern generated at the output frequency pattern calculator 25.

After step SA14, or when judging that the time is not a rising time of voltage normality judgment in step SA11, the standalone operation judgment unit 29 judges whether or not the phase difference $\Delta\theta$ between the phase $\theta g$ of the system voltage Vg and the phase $\theta$ of the output voltage V of the inverter 6 is smaller than or equal to a predetermined threshold (step SA15).

When the phase difference $\Delta\theta$ between the phase $\theta g$ and phase $\theta$ is larger than the predetermined threshold, the standalone operation judgment unit 29 maintains the state where the standalone operation flag is "1", and causes the power conversion apparatus 1 to continue standalone operation (step SA16). In this case, the control to change the frequency of the output voltage of the inverter 6 based on the output frequency pattern generated at the output frequency pattern calculator 25 is continued (step SA17).

The standalone operation judgment unit 29 continues the frequency control according to the output frequency pattern while the phase difference $\Delta\theta$ between the phase $\theta g$ and phase $\theta$ is larger than the predetermined threshold, and changes the standalone operation flag from "1" to "0" when judging that the phase difference $\Delta\theta$ is smaller than or equal to the predetermined threshold in step SA15 (step SA18).

When the standalone operation flag changes from "1" to "0", the open/close command generator 28 generates and outputs a command to close the switch 9 based on the value of the standalone operation flag, thereby closing the switch 9 (step SA19).

Figure 4:
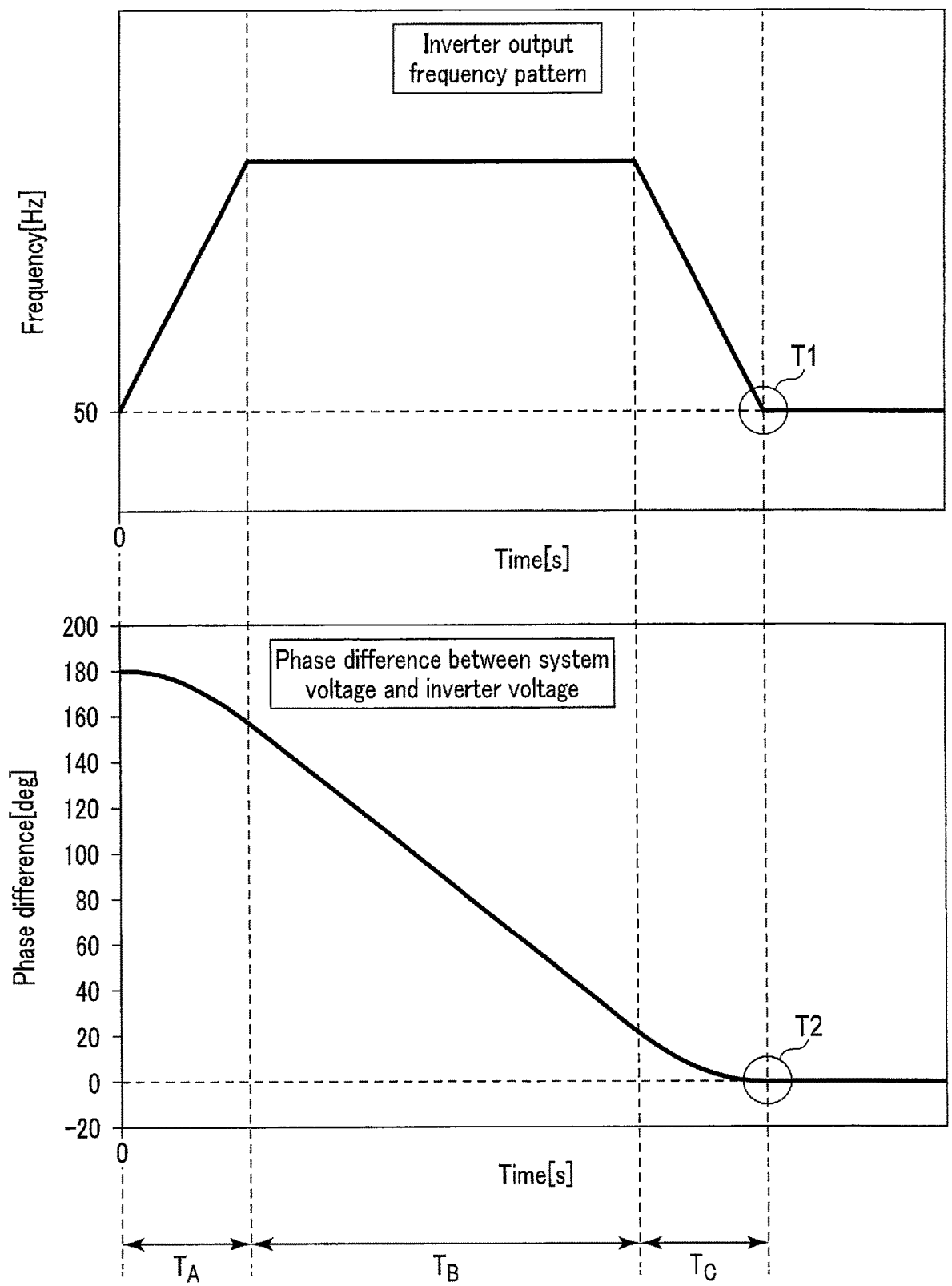
FIG. 4 is a diagram showing an example of a simulation result of the operation of the power conversion apparatus of the first embodiment.

FIG. 4 is a diagram showing an example of a simulation result of the operation of the power conversion apparatus of the first embodiment.

Shown therein is an example of the result of a simulation in which when the phase difference $\Delta\theta$ between the phase $\theta g$ of the system voltage Vg and the phase $\theta$ of the output voltage V of the inverter 6 is 180° at the time of power restoration of the power system 4, the frequency f of the output voltage V of the inverter 6 is changed in line with the output frequency pattern so that the output voltage V of the inverter 6 is synchronized with the system voltage Vg.

The output frequency pattern generated at the output frequency pattern calculator 25 is a pattern in which the frequency is changed from the rate frequency at a predetermined change rate $\Delta f_U$ in the period $T_A$, the frequency is at the frequency upper limit in the period $T_B$, and the frequency is changed at a predetermined frequency change rate $-\Delta f_D$ in the period $T_C$ so that the frequency becomes the rate frequency at the end (T1) of the period $T_C$. The frequency f of the output voltage V of the inverter 6 was changed in line with the output frequency pattern; as a result, the phase difference $\Delta\theta$ became approximately zero at the end (T2) of the period $T_C$, and the power conversion apparatus 1 was enabled to perform interconnected operation with the power system 4.

As described above, the power conversion apparatus 1 of the present embodiment can switch from standalone operation to interconnected operation upon power restoration of the power system 4 without temporarily being halted, and can continuously supply power to the electric load 5. Namely, the present embodiment can provide a power conversion apparatus capable of smoothly cooperating with a power system and continuously supplying power to an electric load.

Next, a power conversion apparatus according to a second embodiment will be described with reference to the accompanying drawings.

In the following description, the same components as those in the above-described first embodiment will be assigned the same reference numerals, and descriptions thereof will be omitted.

The power conversion apparatus 1 of the present embodiment differs from that of the first embodiment in terms of the operation to calculate an output frequency pattern at the output frequency pattern calculator 25.

For example, the system voltage Vg may be unstable immediately after power restoration of the power system 4, and the phase difference $\Delta\theta$ between the phase $\theta g$ of the system voltage Vg and the phase $\theta$ of the output voltage V of the inverter 6 may be larger than the predetermined threshold at the end of the period $T_C$ of the output frequency pattern.

Figure 7:
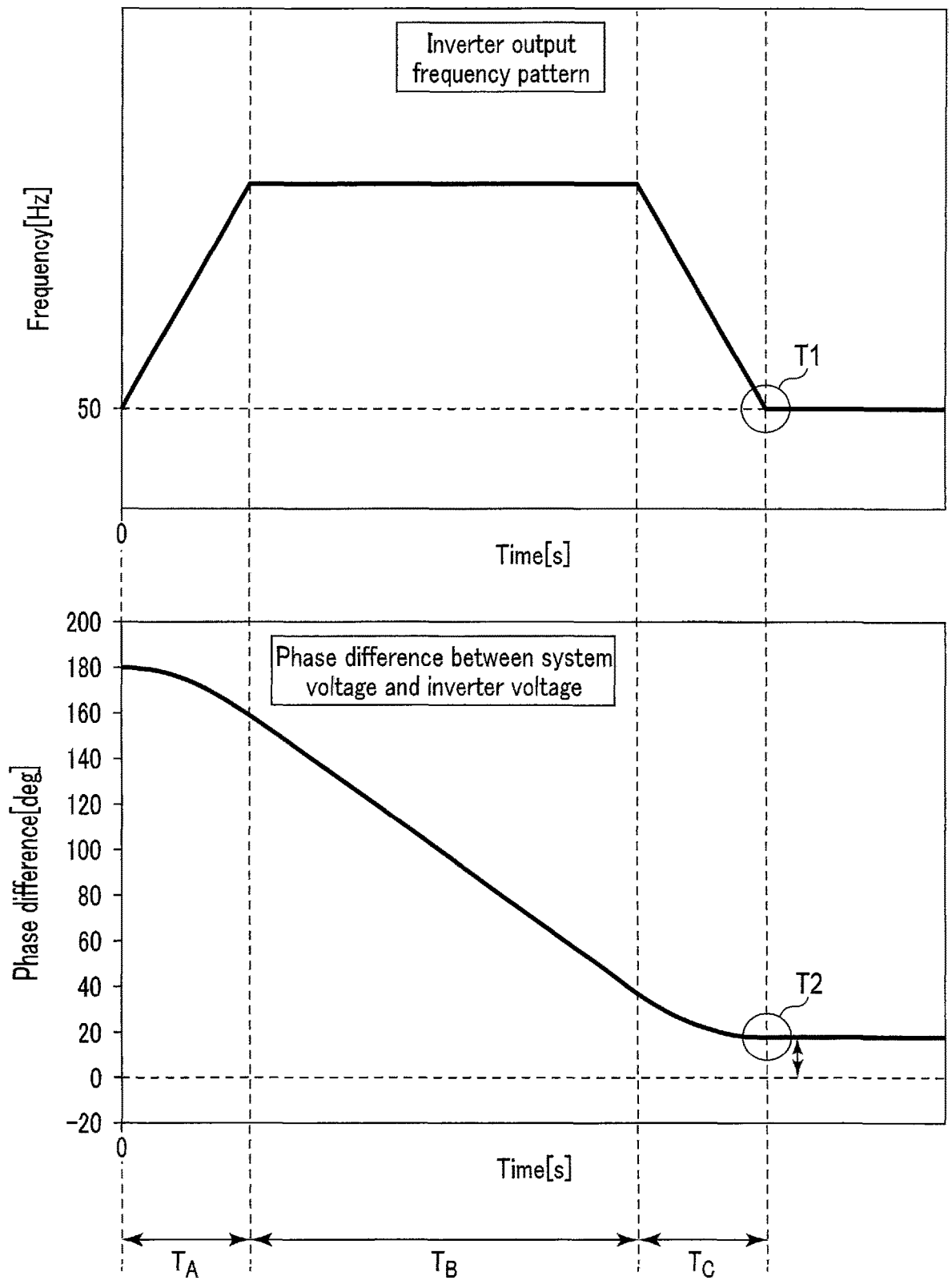
FIG. 7 is a diagram showing an example of a simulation result of a power conversion apparatus of a comparative example.

FIG. 7 is a diagram showing an example of a simulation result of a power conversion apparatus of a comparative example.

Shown therein is an example of the result of a simulation in which when the phase difference Δθ between the phase θg of the system voltage Vg and the phase θ of the output voltage V of the inverter 6 is 180° at the time of power restoration of the power system 4, the frequency f of the output voltage V of the inverter 6 is changed in line with the output frequency pattern so that the output voltage V of the inverter 6 is synchronized with the system voltage Vg.

As in the first embodiment, the output frequency pattern generated at the output frequency pattern calculator 25 is a pattern in which the frequency is changed from the rate frequency at a predetermined change rate $\Delta f_U$ in the period $T_A$, the frequency is at the frequency upper limit in the period $T_B$, and the frequency is changed at a predetermined frequency change rate $-\Delta f_D$ in the period $T_C$ so that the frequency becomes the rate frequency at the end (T1) of the period $T_C$. The frequency f of the output voltage V of the inverter 6 was changed in line with the output frequency pattern; as a result, the phase difference Δθ did not become approximately zero at the end (T2) of the period $T_C$. If the switch 9 is closed in this state, the power conversion apparatus 1 may be stopped by overvoltage or overcurrent.

Therefore, the power conversion apparatus of the present embodiment judges whether or not the phase difference Δθ is smaller than or equal to the predetermined threshold at the end of the period $T_C$, generates again an output frequency pattern (second output frequency pattern) using the current Δθ at the present time when the phase difference Δθ is larger than the threshold, and synchronize the phase θ of the output voltage V of the inverter 6 with the phase θg of the system voltage Vg by changing the frequency f of the output voltage V of the inverter 6 in line with the generated output frequency pattern.

Figure 5A:
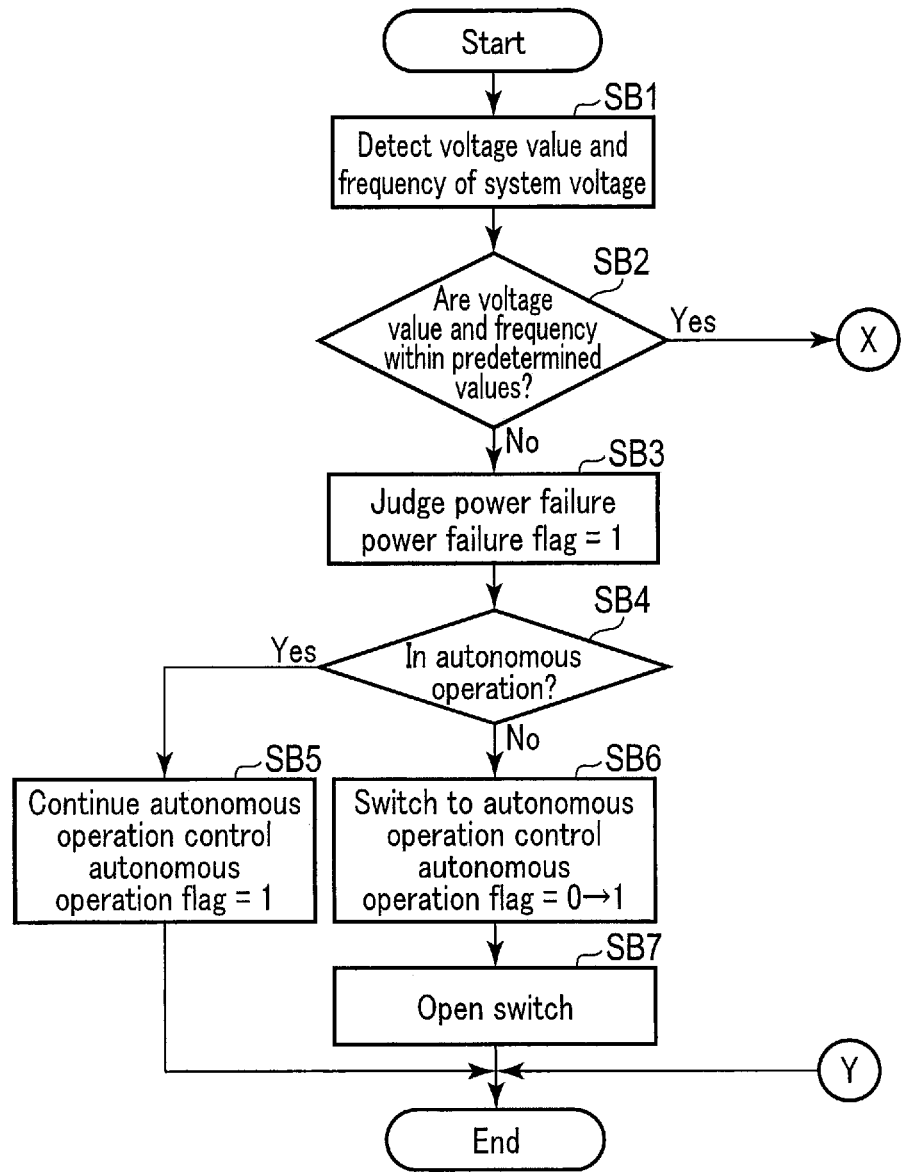
FIG. 5A is a flowchart illustrating an example of an operation of a power conversion apparatus of a second embodiment.
Figure 5B:
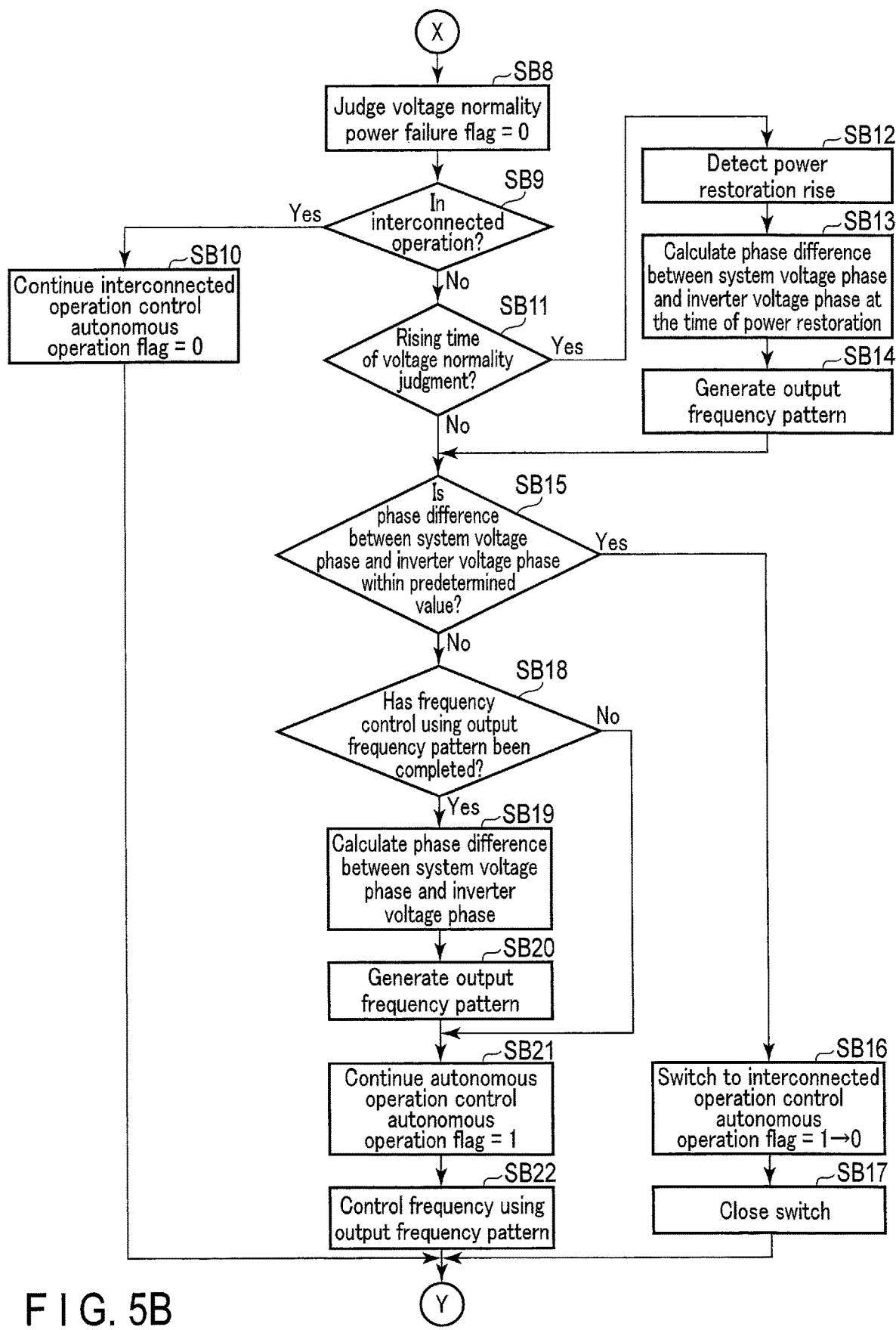
FIG. 5B is a flowchart illustrating the example of the operation of the power conversion apparatus of the second embodiment.

FIGS. 5A and 5B are a flowchart illustrating an example of the operation of the power conversion apparatus of the second embodiment.

The present embodiment differs from the first embodiment in terms of the operation for switching the power conversion apparatus 1 from standalone operation to interconnected operation upon power restoration of the power system 4.

Steps SB1 to SB15 shown in FIGS. 5A and 5B are the same as steps SA1 to SA15 in FIG. 3 of the first embodiment.

After step SB14, or when judging that the time is not a rising time of voltage normality judgment in step SB11, the standalone operation judgment unit 29 judges whether or not the phase difference Δθ between the phase θg of the system voltage Vg and the phase θ of the output voltage V of the inverter 6 is smaller than or equal to the predetermined threshold (step SB15).

The standalone operation judgment unit 29 continues the frequency control using the output frequency pattern while the phase difference Δθ between the phase θg and phase θ is larger than the predetermined threshold, and changes the standalone operation flag from "1" to "O" when judging that the phase difference Δθ is smaller than or equal to the predetermined threshold in step SB15 (step SB16).

When the standalone operation flag changes from "1" to "0", the open/close command generator 28 generates and outputs a command to close the switch 9 based on the value of the standalone operation flag, thereby closing the switch 9 (step SB17).

When judging that the phase difference Δθ between the phase θg and the phase θ is larger than the predetermined threshold in step SB15, the standalone operation judgment unit 29 further judges whether or not frequency control using the output frequency pattern has been completed (the period $T_C$ has ended) (step SB18).

When judging that frequency control using the output frequency pattern has not been completed (the period $T_C$ has not ended), the standalone operation judgment unit 29 maintains the state where the standalone operation flag is "1", and causes the power conversion apparatus 1 to continue standalone operation (step SB21). In this case, the control to change the frequency of the output voltage of the inverter 6 based on the output frequency pattern generated at the output frequency pattern calculator 25 in step SB14 is continued (step SB22).

When judging that frequency control using the output frequency pattern has been completed (the period $T_C$ has ended) in step SB18, the standalone operation judgment unit 29 causes the output frequency pattern calculator 25 to generate an output frequency pattern (second output frequency pattern) The output frequency pattern calculator 25 calculates the phase difference Δθ between the phase θg of the system voltage Vg and the phase θ of the output voltage V of the inverter 6 at the present time (step SB19), and generates an output frequency pattern of the output voltage V of the inverter 6 using the above-mentioned expressions (1), (3), and (6) or expressions (10) and (11) (step SB20).

The output frequency pattern calculator 25 supplies the inverter frequency selection unit 26 with the value of the frequency that changes in line with the re-generated output frequency pattern (second output frequency pattern), and outputs the value as the value of the frequency f of the output voltage of the inverter 6. Accordingly, the output voltage of the inverter 6 is controlled so that the frequency changes based on the output frequency pattern generated at the output frequency pattern calculator 25.

After step SB20, the standalone operation judgment unit 29 maintains the state where the standalone operation flag is "1", and causes the power conversion apparatus 1 to continue standalone operation (step SB21). In this case, the control to change the frequency of the output voltage of the inverter 6 based on the output frequency pattern generated at the output frequency pattern calculator 25 in step SB20 is continued (step SB22).

Figure 6:
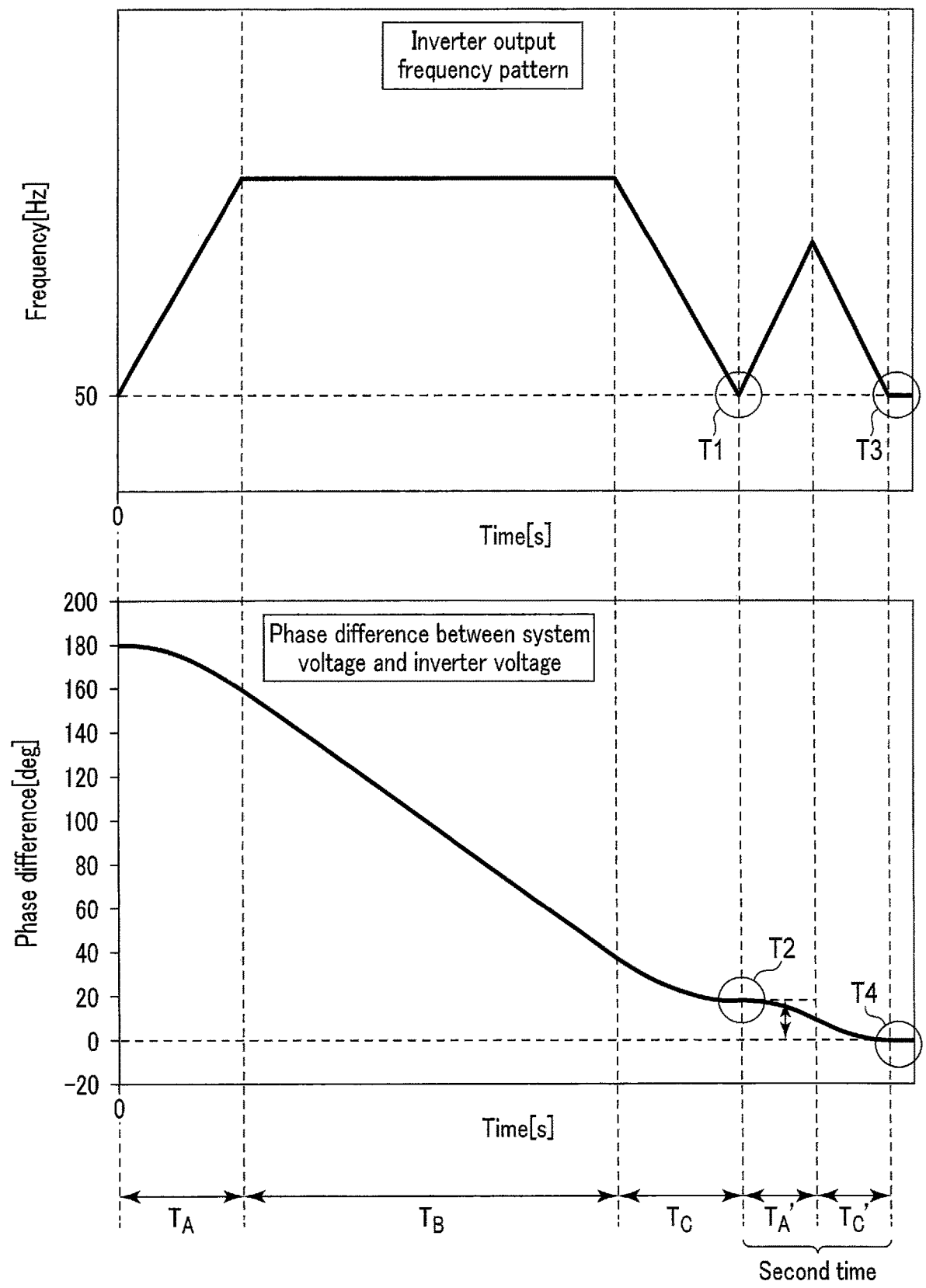
FIG. 6 is a diagram showing an example of a simulation result of the operation of the power conversion apparatus of the second embodiment.

FIG. 6 is a diagram showing an example of a simulation result of the operation of the power conversion apparatus of the second embodiment.

Shown therein is another example of the result of the simulation in which when the phase difference Δθ between the phase θg of the system voltage Vg and the phase θ of the output voltage V of the inverter 6 is 180° at the time of power restoration of the power system 4, the frequency f of the output voltage V of the inverter 6 is changed in line with the output frequency pattern so that the output voltage V of the inverter 6 is synchronized with the system voltage Vg.

The output frequency pattern generated at the output frequency pattern calculator 25 is a pattern in which the frequency is changed from the rate frequency at a predetermined change rate $\Delta f_U$ in the period $T_A$, the frequency is at the frequency upper limit in the period $T_B$, and the frequency is changed at a predetermined frequency change rate $-\Delta f_D$ in the period $T_C$ so that the frequency becomes the rate frequency at the end (T1) of the period $T_C$. The frequency f of the output voltage V of the inverter 6 was changed in line with the output frequency pattern; as a result, the phase difference Δθ exceeded the predetermined threshold at the end (T2) of the period $T_C$.

In this case, the output frequency pattern calculator 25 calculates the phase difference Δθ between the phase θg of the system voltage Vg and the phase θ of the output voltage V of the inverter 6 at the end of period $T_C$, and generates an output frequency pattern using the calculated phase difference Δθ. The output frequency pattern secondly generated by the output frequency pattern calculator 25 is a pattern not including the period in which the frequency is at the upper limit, in which the frequency is changed from the rate frequency at a predetermined change rate $\Delta f_U$ in the period $T_A$, and the frequency is changed at a predetermined frequency change rate $-\Delta fD$ in the period $T_C$ so that the frequency becomes the rate frequency at the end (T3) of the period $T_C$.

The frequency f of the output voltage V of the inverter 6 was changed in line with the secondly generated output frequency pattern; as a result, the phase difference Δθ became approximately zero at the end (T4) of the period $T_C$, and the power conversion apparatus 1 was enabled to perform interconnected operation with the power system 4.

As described above, the power conversion apparatus 1 of the present embodiment can switch from standalone operation to interconnected operation upon power restoration of the power system 4 without temporarily being halted, and can continuously supply power to the electric load 5. In addition, even if the power system 4 is unstable after power restoration for example, the power conversion apparatus 1 can smoothly cooperate with the power system. Namely, the present embodiment can provide a power conversion apparatus capable of smoothly cooperating with a power system and continuously supplying power to an electric load.

Although several embodiments of the present invention have been described, these embodiments are presented as examples and are not intended to limit the scope of the invention. These novel embodiments can be implemented in various forms, and various omissions, replacements, and changes can be made without departing from the spirit of the invention. These embodiments and modifications thereof are included in the scope and spirit of the invention, and are included in the scope of the claimed inventions and their equivalents.

What is claimed is:

1. A power conversion apparatus comprising:
a power supply;
an inverter configured to convert DC power supplied from the power supply into AC power and AC power supplied from a power system into DC power;
a switch configured to switch an electrical connection state of an AC line between an AC terminal of the inverter and an input terminal from the power system;
a first voltage detector configured to detect an output voltage of the inverter;
a second voltage detector configured to detect a system voltage of the power system; and
a control circuit configured to control the inverter and the switch,
wherein the control circuit:
judges whether or not the power system has a power failure, based on values of the system voltage and a frequency of the power system,
calculates, when the power system has recovered from the power failure, a phase difference between a phase of the output voltage of the inverter and a phase of the system voltage and generate, by using the phase difference, an output frequency pattern including a first period in which the frequency is changed at a predetermined frequency change rate and a second period in which the frequency has a predetermined constant value for changing a frequency of the output voltage of the inverter, and
controls the inverter to change the frequency of the output voltage of the inverter using the output frequency pattern, and closes the switch when the phase difference becomes smaller than or equal to a threshold.

2. The power conversion apparatus according to claim 1, wherein the predetermined constant value is at a frequency upper limit or a frequency lower limit.

3. A power conversion apparatus comprising:
a power supply;
an inverter configured to convert DC power supplied from the power supply into AC power and AC power supplied from a power system into DC power;
a switch configured to switch an electrical connection state of an AC line between an AC terminal of the inverter and an input terminal from the power system;
a first voltage detector configured to detect an output voltage of the inverter;
a second voltage detector configured to detect a system voltage of the power system; and
a control circuit configured to control the inverter and the switch,
wherein the control circuit:
judges whether or not the power system has a power failure, based on values of the system voltage and a frequency of the power system,
when the power system has recovered from the power failure,
calculates a phase difference between a phase of the output voltage of the inverter and a phase of the system voltage and generate, by using the phase difference, a first output frequency pattern for changing a frequency of the output voltage of the inverter, and controls the inverter to change the frequency of the output voltage of the inverter using the first output frequency pattern,
re-calculates the phase difference when it is judged that the phase difference is larger than the predetermined threshold after controlling the inverter using the first output frequency pattern, and generates, by using the re-calculated phase difference, a second output frequency pattern for changing the frequency of the output voltage of the inverter, and controls the inverter to change the frequency of the output voltage of the inverter using the second output frequency pattern, and
closes the switch when the phase difference becomes smaller than or equal to a threshold.

4. The power conversion apparatus according to claim 3, wherein the output frequency pattern includes a first period in which the frequency is changed at a predetermined frequency change rate.

5. The power conversion apparatus according to claim 4, wherein the output frequency pattern further includes a second period in which the frequency has a constant value.

6. The power conversion apparatus according to claim 5, wherein the constant value is at a frequency upper limit or a frequency lower limit.

* * * * *